United States Patent
Chang et al.

(10) Patent No.: US 8,885,405 B2
(45) Date of Patent: Nov. 11, 2014

(54) FLASH MEMORY AND ASSOCIATED PROGRAMMING METHOD

(71) Applicant: eMemory Technology Inc., Hsin-Chu (TW)

(72) Inventors: Che-Wei Chang, Hsinchu County (TW); Chia-Fu Chang, Chiayi County (TW); Yu-Hsiung Tsai, Hsinchu (TW); Chia-Jung Hsu, Taoyuan County (TW)

(73) Assignee: eMemory Technology Inc., Hsin-Chu (TW)

( * ) Notice: Subject to any disclaimer, the term of this patent is extended or adjusted under 35 U.S.C. 154(b) by 127 days.

(21) Appl. No.: 13/755,045

(22) Filed: Jan. 31, 2013

(65) Prior Publication Data

US 2014/0211562 A1    Jul. 31, 2014

(51) Int. Cl.
*G11C 16/04*    (2006.01)
*G11C 16/10*    (2006.01)

(52) U.S. Cl.
CPC ...................................... *G11C 16/10* (2013.01)
USPC ............. 365/185.03; 365/185.18; 365/185.24

(58) Field of Classification Search
USPC ............. 365/185.03, 185.18, 185.24, 185.19, 365/185.33
See application file for complete search history.

(56) References Cited

U.S. PATENT DOCUMENTS 5,712,815 A     1/1998 Bill et al.
8,432,734 B2 *  4/2013 Kim ......................... 365/185.03

* cited by examiner

*Primary Examiner* — David Lam
(74) *Attorney, Agent, or Firm* — WPAT, PC; Justin King

(57) ABSTRACT

A flash memory includes a program voltage generator, plural memory units, a current limiter, and a multi-bit program control unit. The program voltage generator is used for providing a constant program voltage during a detecting cycle and providing a dynamically-adjustable program voltage during a program cycle. The plural memory units output plural drain currents and plural data line voltages to plural data lines. The current limiter is used for receiving a reference current and a reference voltage, thereby controlling the plural drain currents. During the detecting cycle, a specified data line voltage of the plural data line voltages with the minimum voltage level is detected by the multi-bit program control unit. During the program cycle, the specified data line voltage is used as a feedback voltage, and the dynamically-adjustable program voltage is generated by the program voltage generator according to the feedback voltage.

11 Claims, 7 Drawing Sheets

FLASH MEMORY AND ASSOCIATED PROGRAMMING METHOD

FIELD OF THE INVENTION

The present invention relates to a flash memory, and more particularly to a flash memory and associated programming method for simultaneously programming multiple bits of data.

BACKGROUND OF THE INVENTION

A flash memory is a non-volatile data storage device that can be electrically programmed (or rewritten). Consequently, the flash memory is widely used to store data.

FIG. 1 is a schematic circuit diagram illustrating a conventional flash memory. As shown in FIG. 1, the flash memory comprises a memory array 10 and a path control circuit 18. The memory array 10 comprises plural memory units. For clarification and brevity, only two memory units 11 and 12 are shown. Each of the memory units 11 and 12 comprises a select transistor and a storage transistor. For example, the storage transistor is a metal-oxide-semiconductor transistor comprising a gate terminal, a drain terminal, a source terminal and a charge storage structure (e.g. a floating gate). The storage transistor Ma of the first memory unit 11 and the storage transistor Mb of the second memory unit 12 can store data (e.g. one bit of data).

Please refer to FIG. 1 again. The first memory unit 11 comprises a select transistor Pa and a storage transistor Ma. The second memory unit 12 comprises a select transistor Pb and a storage transistor Mb. The select transistors Pa and Pb are p-channel metal-oxide-semiconductor transistors. The storage transistors Ma and Mb are p-channel metal-oxide-semiconductor transistors with charge storage structures. The source terminals of the select transistors Pa and Pb are connected to a power source voltage V1. The gate terminals of the select transistors Pa and Pb are connected to a node n0, and further connected to a select voltage Vsel. The gate terminals of the storage transistors Ma and Mb are connected to a node n1 (i.e. a control line terminal) through a control line and further connected to a program voltage Vpgm. The drain terminals of the storage transistors Ma and Mb are connected to the path control circuit 18.

During the process of programming the first memory unit 11, the first memory unit 11 is enabled by the path control circuit 18, but the other memory units are disabled. According to the settings, the select transistor Pa is turned on in response to the select voltage Vsel. Consequently, a first programming current Ipgm1 flows through the drain terminal and the source terminal of the storage transistor Ma according to the program voltage Vpgm. When the first programming current Ipgm1 flows through the storage transistor Ma, charges (e.g. electrons) are injected into the floating gate of the storage transistor Ma. Consequently, the threshold voltage of the storage transistor Ma is changed, and the storage transistor Ma is programmed.

After the first memory unit 11 is programmed, the process of programming the second memory unit 12 is continuously done. Similarly, during the process of programming the second memory unit 12, the second memory unit 12 is enabled by the path control circuit 18, but the other memory units are disabled. According to the settings, the select transistor Pb is turned on in response to the select voltage Vsel. Consequently, a second programming current (not shown) flows through the drain terminal and the source terminal of the storage transistor Mb according to the program voltage Vpgm. When the second programming current flows through the storage transistor Mb, charges (e.g. electrons) are injected into the floating gate of the storage transistor Mb. Consequently, the threshold voltage of the storage transistor Mb is changed, and the storage transistor Mb is programmed.

The above procedures are repeatedly done until all of the memory units are programmed.

From the above discussions, the memory units of the conventional flash memory should be sequentially programmed one by one. That is, only one bit of data can be programmed at each time. Moreover, different storage transistors usually have different properties. During the programming process, the magnitude of the program voltage Vpgm should be adjusted according to the properties of respective storage transistors. Since the conventional flash memory is unable to program multiple bits of data simultaneously, the programming time period of the conventional flash memory is very long.

SUMMARY OF THE INVENTION

The present invention provides a flash memory for simultaneously programming multiple bits of data in order to effectively reduce the programming time period.

An embodiment of the present invention provides a flash memory. The flash memory includes a program voltage generator, plural memory units, a current limiter, and a multi-bit program control unit. The program voltage generator is used for providing a constant program voltage during a detecting cycle and providing a dynamically-adjustable program voltage during a program cycle. The plural memory units are used for receiving the constant program voltage or the dynamically-adjustable program voltage, and outputting plural drain currents and plural data line voltages to plural data lines. The current limiter is connected to the plural data lines for receiving a reference current and a reference voltage, thereby controlling the plural drain currents. The multi-bit program control unit is connected to the plural data lines. During the detecting cycle, a specified data line voltage of the plural data line voltages with the minimum voltage level is detected by the multi-bit program control unit. During the program cycle, the specified data line voltage is used as a feedback voltage, and the dynamically-adjustable program voltage is generated by the program voltage generator according to the feedback voltage.

An embodiment of the present invention provides a method for simultaneously programming multiple bits of a flash memory having a plurality of memory units comprising: providing an initial program voltage to the plurality of memory units; determining a specified memory unit which has a minimum threshold voltage level among the plurality of memory units; adjusting a program voltage which is for simultaneously programming the plurality of memory units dynamically according to a data line voltage of the specific memory unit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
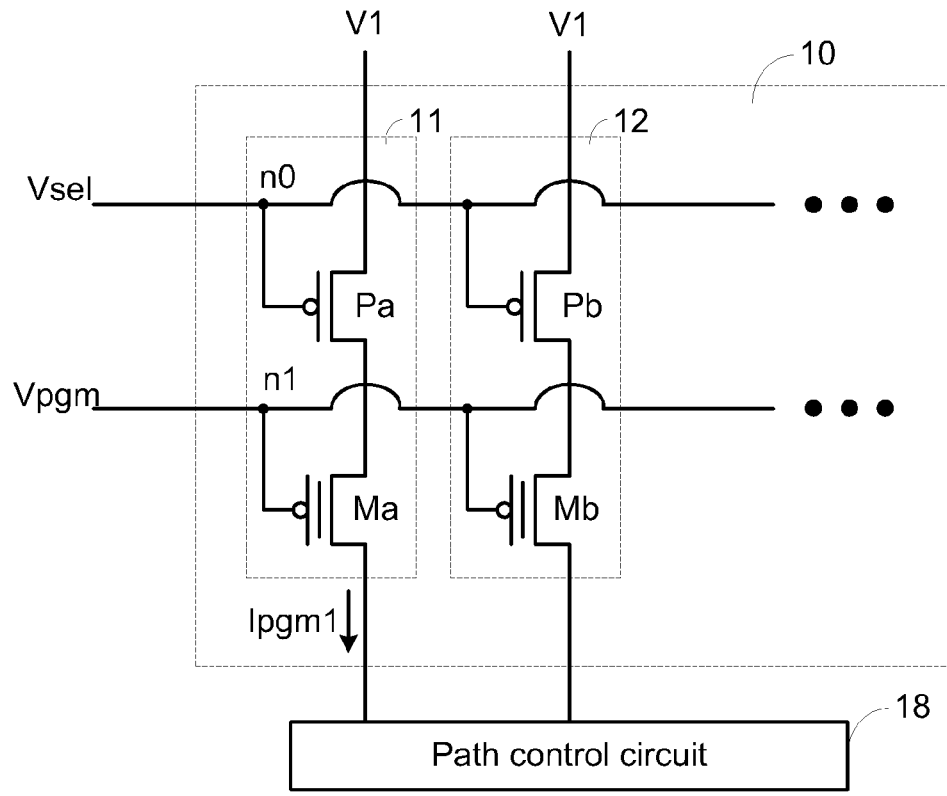
FIG. 1 (prior art) is a schematic circuit diagram illustrating a conventional flash memory.
Figure 2A:
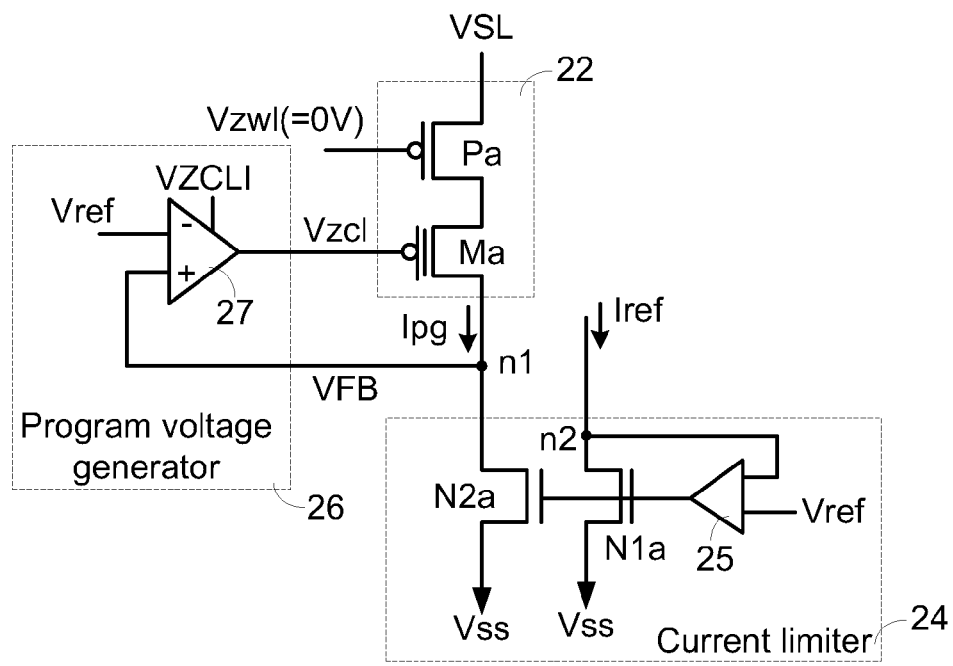
FIG. 2A is a schematic circuit diagram illustrating a programming circuit for programming a single memory unit according to the present invention.

Hereinafter, a circuit for programming a single memory unit will be illustrated with reference to FIG. 2A. FIG. 2A is a schematic circuit diagram illustrating a programming circuit for programming a single memory unit according to the present invention. The programming circuit is applied to a flash memory. As shown in FIG. 2A, the flash memory comprises a memory unit 22, a program voltage generator 26, and a current limiter 24. The memory unit 22 is included in a memory array of the flash memory. The memory unit 22 comprises a select transistor Pa and a storage transistor Ma. The select transistor Pa is a p-channel metal-oxide-semiconductor transistor. The storage transistor Ma is a p-channel metal-oxide-semiconductor transistor with a charge storage structure. The charge storage structure is a floating gate.

The source terminal of the select transistor Pa is connected to a power source voltage VSL. The gate terminal of the select transistor Pa is connected to a select voltage Vzwl. In a case that the select voltage Vzwl is 0V, it means that this select transistor Pa is selected to be turned on. The gate terminal of the storage transistor Ma is connected to a program voltage Vzcl along a control line. The drain terminal of the storage transistor Ma is connected to a node n1 along a data line. The data line is also referred as a bit line.

During the process of programming the storage transistor Ma, the select transistor Pa is turned on. Consequently, a programming current Ipg flows through the drain terminal and the source terminal of the storage transistor Ma according to the program voltage Vzcl.

The current limiter 24 is connected to the node n1 to receive the programming current Ipg. The current limiter 24 comprises two transistors N1a, N2a (e.g. n-channel metal-oxide-semiconductor transistors) and an amplifier 25 (e.g. an operational amplifier). The gate terminal, the drain terminal and the source terminal of the transistor N1a are connected to an output terminal of the amplifier 25, a node n2 and a ground voltage Vss, respectively. A reference current Iref is provided to the node n2. The gate terminal, the drain terminal and the source terminal of the transistor N2a are connected to the output terminal of the amplifier 25, the node n1 and the ground voltage Vss, respectively. Moreover, two input terminals of the amplifier 25 are connected to the node n2 and a reference voltage Vref, respectively.

The program voltage generator 26 comprises an amplifier 27 (e.g. a differential amplifier). The amplifier 27 is connected to a supply voltage VZCLI. Moreover, a positive end, a negative end and an output terminal of the amplifier 27 are connected to the node n1, the reference voltage Vref, and the gate terminal of the storage transistor Ma, respectively.

In the current limiter 24, a virtual short circuit between the two input terminals of the amplifier 25 is used to correlate the reference current Iref of the transistor N1a with the reference voltage Vref. In this embodiment, both of the reference current Iref and the reference voltage Vref are maintained constant during the program cycle. Consequently, a current mirror defined by the transistors N1a and N2a may limit the magnitude of the programming current Ipg to be close to the magnitude of the reference current Iref.

In the program voltage generator 26, a feedback voltage VFB from the node n1 may reflect the magnitude of the programming current Ipg. As the storage transistor Ma is gradually programmed, the magnitude of the programming current Ipg is increased and the magnitude of the feedback voltage VFB is increased. Consequently, the voltage difference between the feedback voltage VFB and the reference voltage Vref is increased. In other words, since the magnitude of the program voltage Vzcl is gradually increased by the amplifier 27, the magnitude of the programming current Ipg is gradually decreased.

Figure 2B:
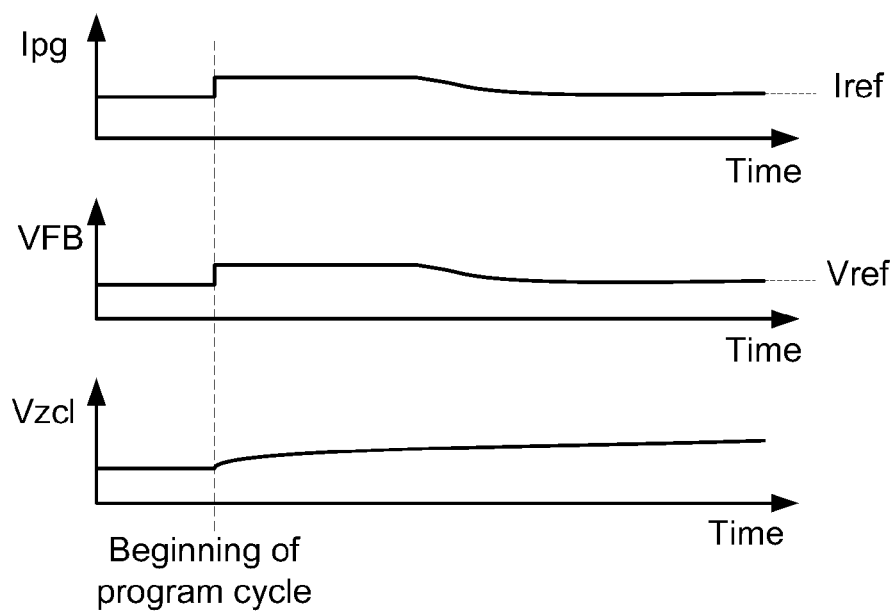
FIG. 2B schematically illustrates the changes of the programming current Ipg, the feedback voltage VFB and the program voltage Vzcl during the program cycle.

FIG. 2B schematically illustrates the changes of the programming current Ipg, the feedback voltage VFB and the program voltage Vzcl during the program cycle. In the beginning of the program cycle, the magnitude of a drain current of the storage transistor Ma (i.e. the programming current Ipg) abruptly rises up to a higher level. Correspondingly, the magnitude of the feedback voltage VFB rises up to a higher level. As the magnitude of the feedback voltage VFB is increased, a gate voltage of the storage transistor Ma (i.e. the program voltage Vzcl) is increased by the program voltage generator 26. As the program voltage Vzcl is increased, the turning on conduction of the storage transistor Ma is limited. Consequently, the magnitude of the programming current Ipg is decreased to be close to the magnitude of the reference current Iref. Moreover, as the programming current Ipg is decreased, the magnitude of the feedback voltage VFB is decreased to be close to the magnitude of the reference voltage Vref. Moreover, since the threshold voltage of the storage transistor Ma is continuously changed during the program cycle, the magnitude of the program voltage Vzcl is gradually increased to maintain a fixed programming current Ipg. At the time when the feedback voltage VFB is close to the reference voltage Vref and the program voltage Vzcl is close to the supply voltage VZCLI, the program cycle is terminated.

For example, for programming the flash memory of FIG. 2A, the magnitudes of the power source voltage VSL, the supply voltage VZCLI and the reference voltage Vref are respectively set as 5.7V, 8.5V and 0.3V, and the reference current Iref is set as 12 microamperes. During the program cycle, the program voltage Vzcl is increased from 2.7V to 8.3V by the amplifier 27. Consequently, the programming current Ipg is decreased from 13.3 microamperes to 12 microamperes, and the feedback voltage VFB is decreased from 1.6V to 0.3V.

Based on the architecture of FIG. 2A, the present invention provides a flash memory for simultaneously programming multiple bits of data. During a detecting cycle before the program cycle, a storage unit of a memory unit with the minimum threshold voltage is selected from plural memory units. The storage transistor with the minimum threshold voltage is referred as a slow-bit storage transistor.

From the above discussions, when a program voltage is provided to plural memory units, the magnitude of the drain current generated by the slow-bit storage transistor is lower than the magnitudes of the drain currents of other storage transistors. Consequently, the program voltage for programming the slow-bit storage transistor can successfully program the storage transistors of other memory units. In other words, the program voltage for programming the slow-bit storage transistor can be used for programming all storage transistors simultaneously.

In accordance with the present invention, a data line voltage generated by the slow-bit storage transistor is used as a feedback voltage in the beginning of the program cycle. According to the feedback voltage, a dynamically-adjustable program voltage is generated by the program voltage generator to program all memory units. Consequently, the purpose of for simultaneously programming multiple bits of data is achievable. Hereinafter, a method for simultaneously programming eight memory units (i.e. a byte program) will be illustrated. It is noted that the number of memory units to be simultaneously programmed may be varied according to the practical requirements.

Figure 3:
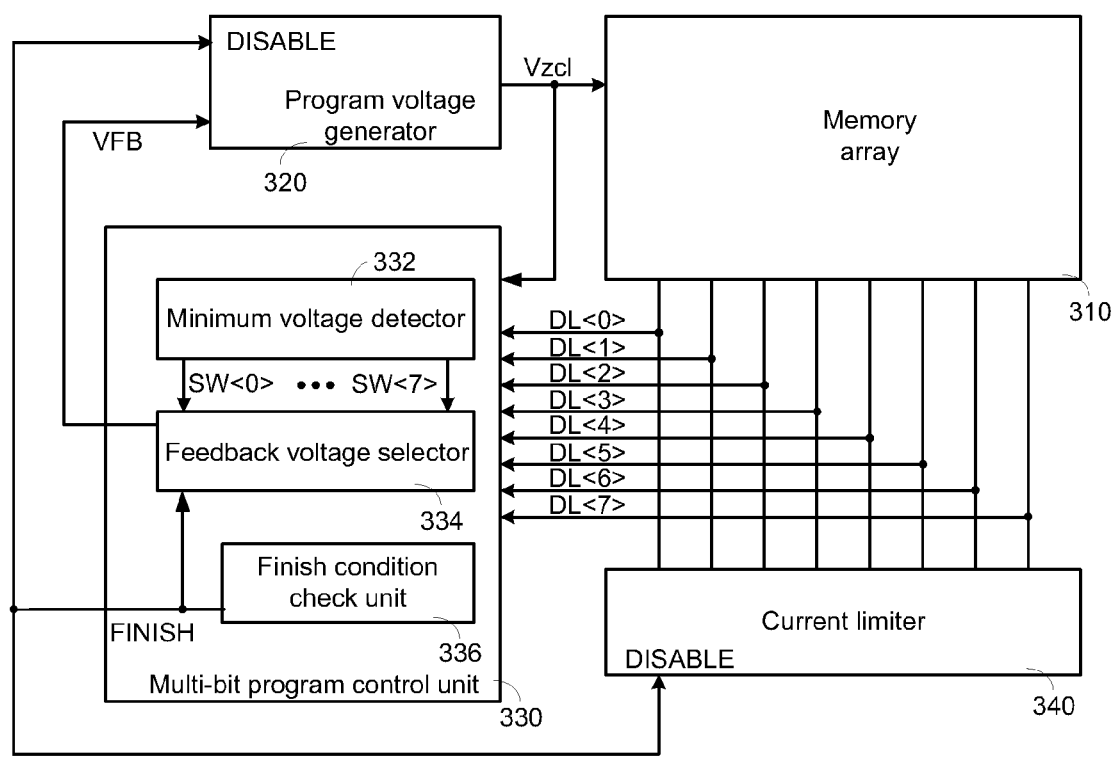
FIG. 3 is a schematic circuit block diagram illustrating a flash memory according to an embodiment of the present invention.

FIG. 3 is a schematic circuit block diagram illustrating a flash memory according to an embodiment of the present invention. As shown in FIG. 3, the flash memory comprises a memory array 310, a program voltage generator 320, a multi-bit program control unit 330, and a current limiter 340. The memory array 310 at least comprises eight memory units (not shown). The program voltage generator 320 is used for generating a program voltage Vzcl. The program voltage Vzcl is transmitted to the eight memory units simultaneously. The eight memory units are connected to the current limiter 340 through eight data lines, respectively. The data line voltages of respective data lines are indicated as DL<0>~DL<7>.

Moreover, the multi-bit program control unit 330 are connected to the eight data lines in order to receive the data line voltages DL<0>~DL<7>. In this embodiment, the multi-bit program control unit 330 comprises a minimum voltage detector 332, a feedback voltage selector 334, and a finish condition check unit 336. Moreover, during a detecting cycle, the minimum voltage detector 332 determines a memory unit with the slow-bit storage transistor according to the data line voltages DL<0>~DL<7>, and issues corresponding switching signals SW<0>~SW<7> to the feedback voltage selector 334. In this context, the slow-bit storage transistor denotes the memory unit whose storage transistor has the minimum threshold voltage.

During the program cycle, the feedback voltage selector 334 selects one of the eight data line voltages DL<0>~DL<7> as the feedback voltage VFB, and sends the feedback voltage VFB to the program voltage generator 320. According to the feedback voltage VFB, the program voltage generator 320 generates the program voltage Vzcl.

The finish condition check unit 336 is used for monitoring the changes of the eight data line voltages DL<0>~DL<7> and the program voltage Vzcl. Moreover, the finish condition check unit 336 determines whether the eight memory units (i.e. one byte) have been programmed according to the changes of the eight data line voltages DL<0>~DL<7> and the program voltage Vzcl. After the program finish is confirmed, the finish condition check unit 336 issues a finish signal FINISH. In response to the finish signal FINISH, the program voltage generator 320 and the current limiter 340 are disabled.

Figure 4A:
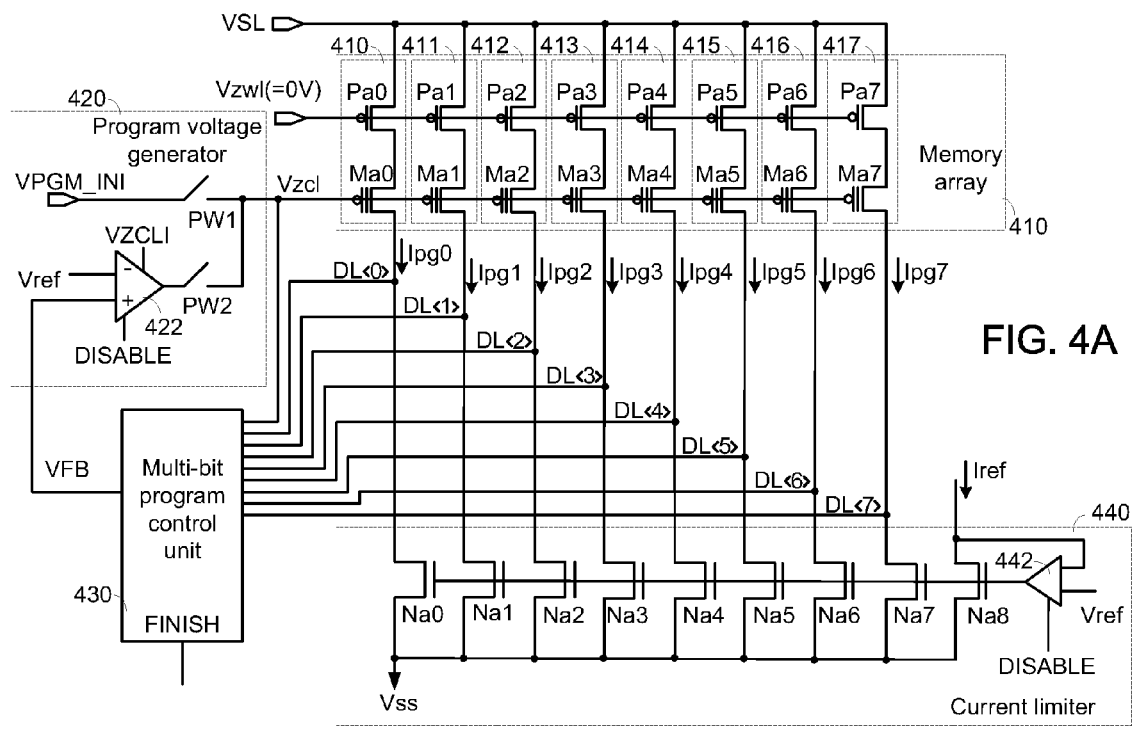
FIGS. 4A~4C are schematic circuit diagrams illustrating the operations of the flash memory according to an embodiment of the present invention.
Figure 4B:
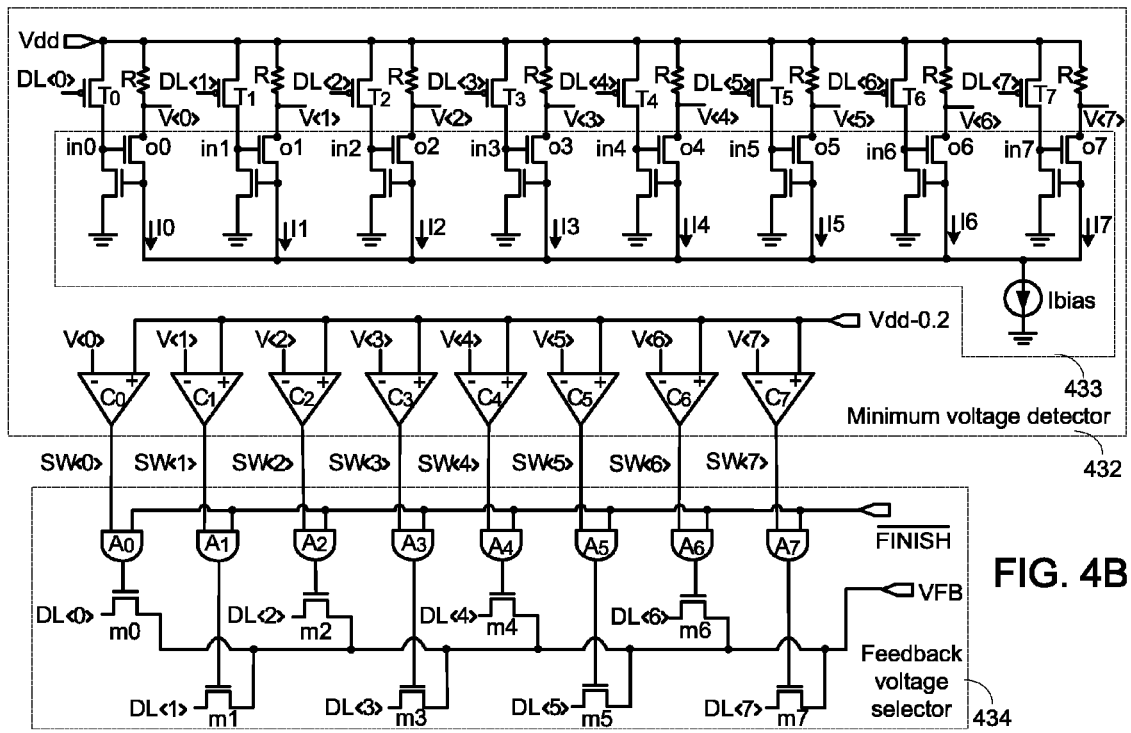
Figure 4C:
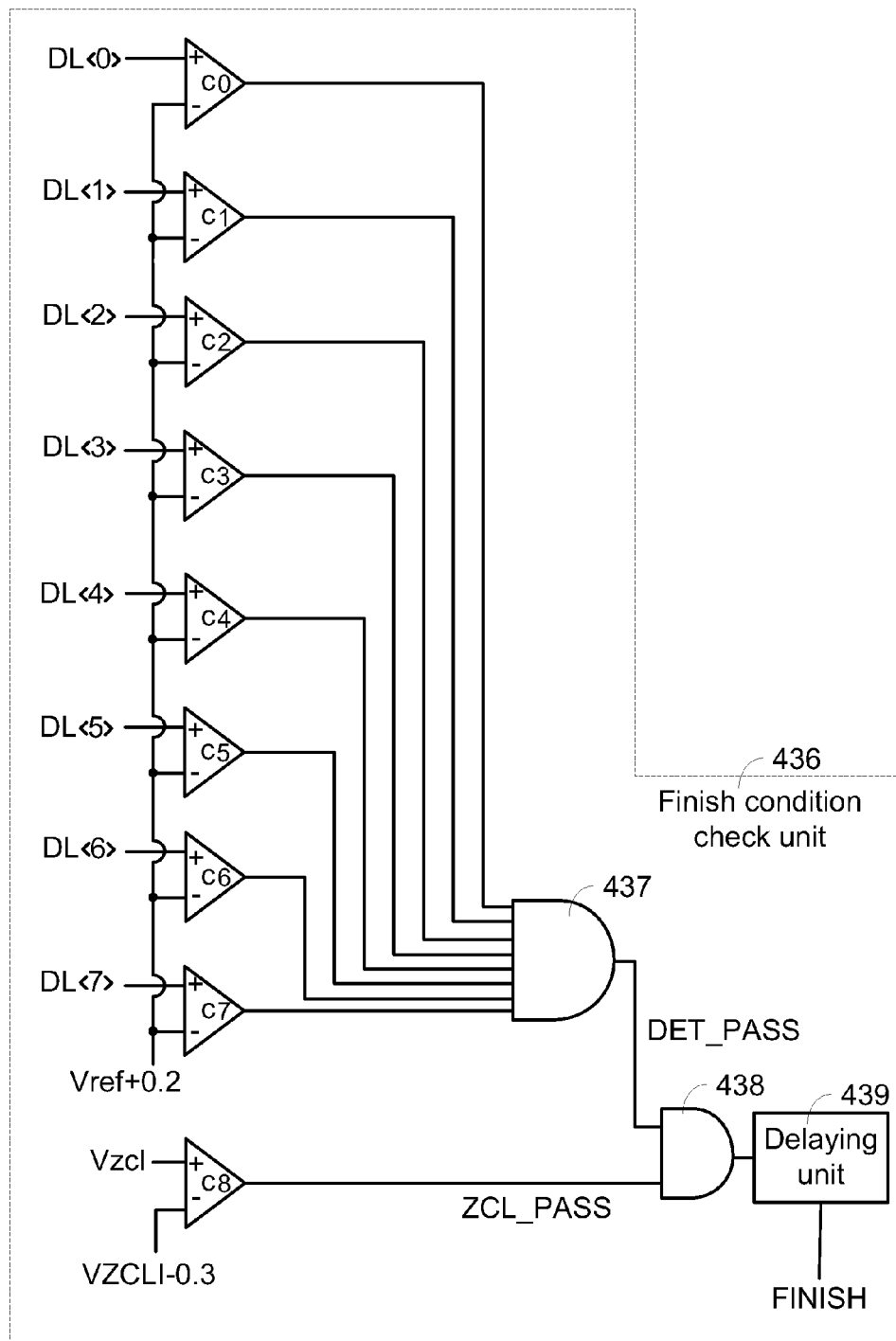

FIGS. 4A~4C are schematic circuit diagrams illustrating the operations of the flash memory according to an embodiment of the present invention.

As shown in FIG. 4A, the memory array 410 comprises eight memory units 410~417. These memory units 410~417 comprise respective select transistors Pa0~Pa7 and respective storage transistors Ma0~Ma7. The source terminals of the select transistors Pa0~Pa7 are all connected to a power source voltage VSL. The gate terminals of the select transistors Pa0~Pa7 are all connected to a select voltage Vzwl. In a case that the select voltage Vzwl is 0V, it means that all select transistor Pa0~Pa7 are selected to be turned on. Moreover, the source terminals of the storage transistors Ma0~Ma7 are connected to the drain terminals of respective select transistors Pa0~Pa7. The gate terminals of the storage transistors Ma0~Ma7 are all connected to a program voltage Vzcl along a control line. The drain terminals of the storage transistors Ma0~Ma7 are connected to respective data lines.

The current limiter 440 comprises nine transistors Na0~Na8 (e.g. n-channel metal-oxide-semiconductor transistors) and an amplifier 442 (e.g. an operational amplifier). The gate terminals of the transistors Na0~Na8 are all connected to an output terminal of the amplifier 442. The source terminals of the transistors Na0~Na8 are all connected to a ground voltage Vss. The drain terminals of the transistors Na0~Na8 are connected to respective data lines. A first input terminal of the amplifier 442 is connected to the drain terminal of the transistor Na8 and receives a reference current Vref. A second input terminal of the amplifier 442 receives a reference voltage Vref.

The program voltage generator 420 comprises a first switch PW1, an amplifier 422 (e.g. a differential amplifier), and a second switch PW2. In a case that the first switch PW1 is in a close state, the magnitude of the program voltage Vzcl has a constant value, which is equal to an initial voltage VPGM_INI. The amplifier 422 is connected to a supply voltage VZCLI. The amplifier 422 comprises a positive input terminal to receive a feedback voltage VFB, a negative input terminal receiving the reference voltage Vref, and an output terminal. In a case that the second switch PW2 is in a close state, the program voltage Vzcl is dynamically adjusted. It is noted that the first switch PW1 and the second switch PW2 are not simultaneously in the close state.

The multi-bit program control unit 430 is used to receive the eight data line voltages DL<0>~DL<7> and the program voltage Vzcl. After the program cycle is terminated, the multi-bit program control unit 430 issues a finish signal FINISH. In response to the finish signal FINISH, the program voltage generator 420 and the current limiter 440 are disabled.

In this embodiment, the first switch PW1 of the program voltage generator 420 is in the close state during the detecting cycle. Consequently, the magnitude of the program voltage Vzcl is constant and equal to the initial voltage VPGM_INI. Since the threshold voltages of the storage transistors Ma0~Ma7 of the memory units 410~417 are not identical, the magnitudes of the drain currents Ipg0~Ipg7 generated according to the initial voltage VPGM_INI are different. Generally, the slow-bit storage transistor has the minimum drain current. In other words, the data line voltage corresponding to the slow-bit storage transistor is the minimum.

During the detecting cycle, the multi-bit program control unit 430 determines the slow-bit storage transistor according to the minimum value of the eight data line voltages DL<0>~DL<7>. Then, during the program cycle, the data line voltage corresponding to the slow-bit storage transistor is used as the feedback voltage VFB. According to the feedback voltage VFB, the program voltage generator 420 generates the program voltage Vzcl.

As shown in FIG. 4B, the minimum voltage detector 432 is used to determine the minimum value of the eight data line voltages DL<0>~DL<7>, and the feedback voltage selector 434 selects the minimum value of the eight data line voltages DL<0>~DL<7> as the feedback voltage VFB.

For example, if the fifth data line voltage DL<5> has the minimum value during the detecting cycle, the fifth data line voltage DL<5> is used as the feedback voltage VFB during the program cycle. In addition, the program voltage generator 420 generates the program voltage Vzcl according to the feedback voltage VFB.

During the program cycle, the second switch PW2 of the program voltage generator 420 is in the close state. In addition, the minimum data line voltage (i.e. the fifth data line voltage DL<5>) is used as the feedback voltage VFB, and transmitted from the multi-bit program control unit 430 to the program voltage generator 420. Consequently, the amplifier 422 issues the program voltage Vzcl to the eight memory units 410~417 according to the correlation between the reference voltage Vref and the feedback voltage VFB. As previously described in FIG. 2B, during the program cycle, the magnitude of the program voltage Vzcl is gradually increased to maintain the programming current (e.g. the fifth programming current Ipg5) to be close to the magnitude of the reference current Iref. In addition, the magnitude of the feedback voltage VFB is gradually decreased to be close to the magnitude of the reference voltage Vref.

During the program cycle, the magnitude of the feedback voltage VFB is gradually decreased to be close to the magnitude of the reference voltage Vref. In addition, the magnitudes of other data line voltages are also gradually decreased to be close to the magnitude of the reference voltage Vref. Consequently, the multi-bit program control unit 430 may continuously monitor the eight data line voltages DL<0>~DL<7> and the program voltage Vzcl. In a case that the magnitudes of the eight data line voltages DL<0>~DL<7> are all smaller than a first predetermined value and the program voltage Vzcl is larger than a second predetermined value, it is confirmed that the eight memory units 410~417 have been programmed. Meanwhile, the multi-bit program control unit 430 issues the finish signal FINISH. In response to the finish signal FINISH, the program voltage generator 420 and the current limiter 440 are disabled.

The detailed architecture of the multi-bit program control unit 430 will be illustrated with reference to FIGS. 4B and 4C. The multi-bit program control unit 430 comprises the minimum voltage detector 432, the feedback voltage selector 434, and the finish condition check unit 436. The architecture of the multi-bit program control unit 430 as shown in FIGS. 4B and 4C is presented herein for purpose of illustration and description only. Those skilled in the art will readily observe that numerous modifications and alterations may be made while retaining the teachings of the invention. That is, the architecture of the multi-bit program control unit 430 is not restricted as long as the functions of the minimum voltage detector 432, the feedback voltage selector 434 and the finish condition check unit 436 are achievable.

As shown in FIG. 4B, the minimum voltage detector 432 comprises an 8-bit winner-take-all circuit 433 (also referred as a WTA circuit). The WTA circuit 433 is one type of the known analog circuits, and the detailed operating principle thereof is not redundantly described herein. In the minimum voltage detector 432, the gate terminals of eight transistors T0~T7 are connected to the eight data line voltages DL<0>~DL<7>, respectively. The source terminals of the eight transistors T0~T7 are connected to another supply voltage Vdd. The drain terminals of the eight transistors T0~T7 are connected to eight input terminals in0~in7 of the WTA circuit 433, respectively. Moreover, eight resistors R are connected between the supply voltage Vdd and eight output terminals o0~o7 of the WTA circuit 433, respectively.

After the eight data line voltages DL<0>~DL<7> are inputted into the WTA circuit 433, only one of the output terminals o0~o7 of the WTA circuit 433 corresponding to the minimum data line voltage can generate the output current, which is equal to a bias current Ibias. Whereas, the magnitudes of the output currents of the other output terminals are all zero. For example, if the fifth data line voltage DL<5> is the minimum among the eight data line voltages, the fifth output voltage I5 is equal to the bias current Ibias, but the other output currents I0~I4 and I6~I7 are all zero. Under this circumstance, the voltage levels of the output signals V<0>~V<4> and V<6>~V<7> are all equal to the magnitude of the supply voltage Vdd. Whereas, only the voltage level of the output signal V<5> (i.e. about Vdd−R×Ibias) is smaller than the voltage Vdd.

The minimum voltage detector 432 further comprises eight comparators C0~C7 for comparing the correlations between the eight output signals V<0>~V<7> and the magnitude (Vdd−0.2), thereby outputting respective switching signals SW<0>~SW<7>. Since the fifth data line voltage DL<5> is the minimum, only the fifth switching signal SW<5> is at a high level state, but the other switching signals SW<0>~V<4> and SW<6>~V<7> are all at a low level state.

Please refer to FIG. 4B again. The feedback voltage selector 434 comprises eight AND gates A0~A7. The eight switching signals SW<0>~SW<7> are received by first input terminals of the eight AND gates A0~A7, respectively. An inverted finish signal $\overline{\text{FINISH}}$ is received by all of second input terminals of the eight AND gates A0~A7. These AND gates A0~A7 perform AND operations. In a case that the finish signal FINISH is at the low level state and the fifth switching signal SW<5> is at the high level state but the other switching signals SW<0>~V<4> and SW<6>~V<7> are all at the low level state, the transistor m5 of the feedback voltage selector 434 is turned on. Consequently, the fifth data line voltage DL<5> is used as the feedback voltage VFB.

Unless the programming task is failed, in the final stage of the program cycle, the magnitudes of the eight data line voltages DL<0>~DL<7> will be decreased to be near the reference voltage Vref, and the program voltage Vzcl will be increased to be near the supply voltage VZCLI. Moreover, when the program voltage Vzcl is reached and constrained at the level of the supply voltage VZCLI during the program cycle, the magnitudes of the eight data line voltages DL<0>~DL<7> will be then increased in response to the constrained program voltage Vzcl.

Consequently, in the finish condition check unit 436 as shown in FIG. 4C, eight comparators c0~c7 (also referred as a first comparing circuit) are used to determine the correlations between the eight data line voltages DL<0>~DL<7> and the magnitude (Vref+0.2), and an additional comparator c8 (also referred as a second comparing circuit) is used to determine the correlation between the program voltage Vzcl and the magnitude (VZCLI−0.3). When the magnitudes of the eight data line voltages DL<0>~DL<7> are all larger than the magnitude (Vref+0.2), an AND gate 437 generates a high-level detection pass signal DET_PASS. Moreover, when the program voltage Vzcl is larger than the magnitude (VZCLI−0.3), the second comparing circuit generates a high-level program voltage pass signal ZCL_PASS. After the high-level detection pass signal DET_PASS and the high-level program voltage pass signal ZCL_PASS are received by an AND gate 438, a high-level finish signal FINISH is generated after delayed by a delaying unit 439. Meanwhile, the finish condition check unit 436 issues the finish signal FINISH to notify the program voltage generator 420 and the current limiter 440 of disabling the program cycle.

For example, for programming the flash memory of FIGS. 4A~4C, the magnitudes of the power source voltage VSL, the supply voltage VZCLI and the reference voltage Vref are respectively set as 5.7V, 8.5V and 0.3V, and the reference current Iref is set as 12 microamperes. During the program cycle, the program voltage Vzcl is increased from 2.7V to 8.3V by the amplifier 27. Consequently, the programming current Ipg is decreased from 13.3 microamperes to 12 microamperes, and the DL<0>~DL<7> are decreased from 1.6V to 0.3V, then increased to a level higher than 0.5V (Vref+0.2V).

Figure 5:
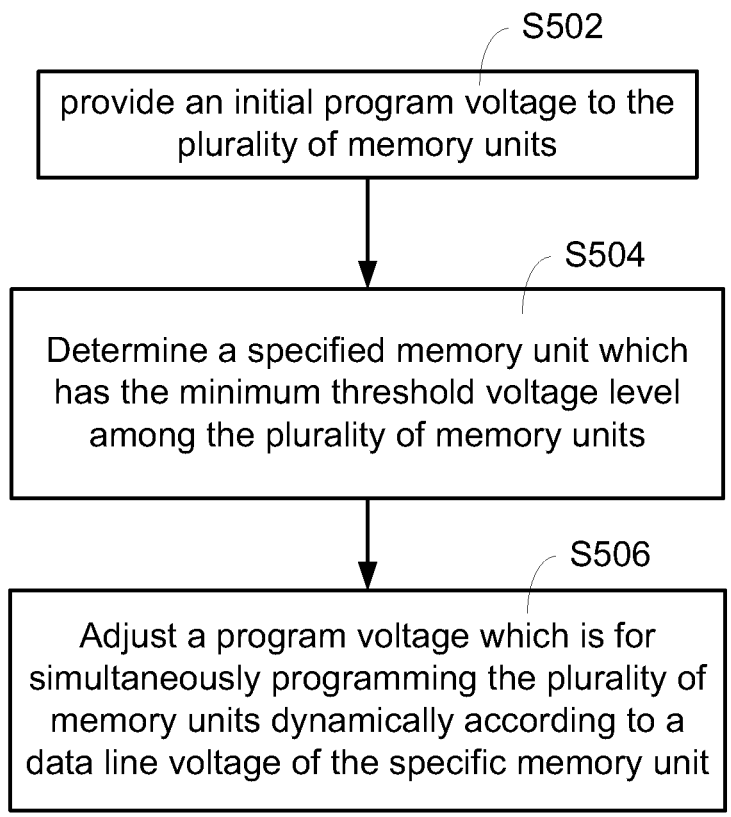
FIG. 5 is a flow chart showing a method for simultaneously programming multiple bits of a flash memory according to the present invention.

As shown in FIG. 5, it is a flow chart showing a method for simultaneously programming multiple bits of a flash memory according to the present invention. Firstly, provide an initial program voltage to the plurality of memory units (S502). Then, determine a specified memory unit which has the minimum threshold voltage level among the plurality of memory units (S504). Then, adjust a program voltage which is for simultaneously programming the plurality of memory units dynamically according to a data line voltage of the specific memory unit (S506).

From the above discussions, the present invention provides a flash memory and associated programming method. During a detecting cycle, a memory unit with a slow-bit storage transistor is searched and the slow-bit storage transistor is included in the specified memory unit described in step 504. Then, in the beginning of a program cycle, a data line voltage generated by the slow-bit storage transistor is used as a feedback voltage. The feedback voltage is transmitted to a program voltage generator. According to the feedback voltage, the program voltage generator generates a dynamically-adjustable program voltage to program all memory units. Then, all memory units are programmed by the dynamically-adjustable program voltage. Consequently, the purpose of for simultaneously programming multiple bits of data is achievable, and the programming time period is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A flash memory, comprising:
a program voltage generator for providing a constant program voltage during a detecting cycle and providing a dynamically-adjustable program voltage during a program cycle;
a plurality of memory units for receiving the constant program voltage or the dynamically-adjustable program voltage, and outputting plural drain currents and plural data line voltages to plural data lines;
a current limiter connected to the plural data lines for receiving a reference current and a reference voltage, thereby controlling the plural drain currents; and
a multi-bit program control unit connected to the plural data lines, wherein during the detecting cycle, a specified data line voltage of the plural data line voltages with the minimum voltage level is detected by the multi-bit program control unit, wherein during the program cycle, the specified data line voltage is used as a feedback voltage, and the dynamically-adjustable program voltage is generated by the program voltage generator according to the feedback voltage.

2. The flash memory as claimed in claim 1, wherein the multi-bit program control unit comprises:
a minimum voltage detector for receiving the plural data line voltages during the detecting cycle, and generating a switching signal corresponding to the specified data line voltage with the minimum voltage level; and
a feedback voltage selector for selecting the specified data line voltage as the feedback voltage according to the switching signal during the program cycle.

3. The flash memory as claimed in claim 2, wherein the multi-bit program control unit comprises a finish condition check unit, which is enabled during the program cycle, wherein if the magnitudes of the plural data line voltages are all larger than a first predetermined value and the magnitude of the dynamically-adjustable program voltage is larger than a second predetermined value, the finish condition check unit issues a finish signal to notify the program voltage generator and the current limiter of disabling the program cycle.

4. The flash memory as claimed in claim 3, wherein the finish condition check unit comprises:
a first comparing circuit for comparing the plural data line voltages with a third predetermined value, wherein if the plural data line voltages are all smaller than the third predetermined value, the first comparing circuit generates a high-level detection pass signal;
a second comparing circuit for comparing the dynamically-adjustable program voltage with a fourth predetermined value, wherein if the dynamically-adjustable program voltage is larger than the fourth predetermined value, the second comparing circuit generates a high-level program voltage pass signal;
a delaying unit; and
an AND gate, wherein after the high-level detection pass signal and the high-level program voltage pass signal are received by the AND gate, the finish signal is generated, wherein the finish signal is delayed by the delaying unit and then outputted from the finish condition check unit.

5. The flash memory as claimed in claim 2, wherein the minimum voltage detector comprises:
a winner-take-all circuit for receiving the plural data line voltages and generating plural output signals, wherein a specified output signal corresponding to the specified data line voltage which has the minimum voltage level among the plural output signals; and
a group of comparators for respectively comparing the plural output signals with a fifth predetermined value, thereby generating the switching signal, wherein the fifth predetermined value is greater than a voltage level of the first output signal and smaller than the voltage levels of the plural output signals excluding the first output signal.

6. The flash memory as claimed in claim 5, wherein the multi-bit program control unit further comprises a feedback voltage selector, which is enabled during the program cycle, wherein in response to the switching signal, a corresponding switch of the feedback voltage selector is turned on, so that the specified data line voltage is outputted from the feedback voltage selector through the switch to be used as the feedback voltage.

7. The flash memory as claimed in claim 1, wherein the program voltage generator comprises:
a first switch, wherein during the detecting cycle, the first switch is in a close state, and a fixed initial voltage is outputted from the program voltage generator through the first switch to be used as the constant program voltage;

an amplifier comprising a positive input terminal for receiving the feedback voltage, a negative input terminal for receiving the reference voltage, and an output voltage; and a second switch connected with the output terminal of the amplifier, wherein during the program cycle, the second switch is in the close state, and the dynamically-adjustable program voltage is outputted from the program voltage generator through the second switch.

8. The flash memory as claimed in claim 1, wherein each of the plural memory units comprises:

a p-type select transistor comprising a gate terminal connected to a select voltage, a source terminal connected to a power source voltage, and a drain terminal; and a p-type storage transistor comprising a gate terminal receiving the program voltage, a source terminal connected to the drain terminal of the p-type select transistor, and a drain terminal connected to a corresponding data line of the plural data lines, wherein the p-type storage transistor further comprises a storage structure, wherein during the detecting cycle and the program cycle, the p-type select transistor is turned on in response to the select voltage.

9. The flash memory as claimed in claim 1, wherein the current limiter comprises:

plural first transistors corresponding to respective data lines, wherein each of the plural first transistors has a drain terminal connected to a corresponding data line and a source terminal connected to a ground voltage;

a second transistor having a drain terminal receiving the reference current and a source terminal connected to the ground terminal; and an amplifier comprising a first input terminal connected to the drain terminal of the second transistor, a second input terminal receiving the reference voltage, and an output terminal connected to gate terminals of the plural first transistors and a gate terminal of the second transistor.

10. A method for simultaneously programming multiple bits of a flash memory having a plurality of memory units comprising:

providing an initial program voltage to the plurality of memory units;

determining a specified memory unit which has a minimum threshold voltage level among the plurality of memory units;

adjusting a program voltage which is for simultaneously programming the plurality of memory units dynamically according to a data line voltage of the specific memory unit.

11. The method as claimed in claim 10, wherein the specified memory unit includes a slow-bit storage transistor.

* * * * *